(12) United States Patent
Cheon et al.

(10) Patent No.: US 9,159,875 B2
(45) Date of Patent: Oct. 13, 2015

(54) NITRIDE SEMICONDUCTOR LIGHT EMITTING DEVICE AND MANUFACTURING METHOD THEREOF

(71) Applicant: SAMSUNG ELECTRONICS CO., LTD., Gyeonggi-do (KR)

(72) Inventors: Joo Young Cheon, Gyeonggi-do (KR); Yu Ri Sohn, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 56 days.

(21) Appl. No.: 13/783,480

(22) Filed: Mar. 4, 2013

(65) Prior Publication Data

US 2013/0228791 A1 Sep. 5, 2013

(30) Foreign Application Priority Data

Mar. 5, 2012 (KR) .................. 10-2012-0022326

(51) Int. Cl.
| | | |
|---|---|---|
| H01L 33/20 | (2010.01) | |
| H01L 33/02 | (2010.01) | |
| H01L 33/00 | (2010.01) | |
| H01L 33/24 | (2010.01) | |

(52) U.S. Cl.
CPC .............. *H01L 33/20* (2013.01); *H01L 33/007* (2013.01); *H01L 33/025* (2013.01); *H01L 33/24* (2013.01)

(58) Field of Classification Search
CPC ....... H01L 33/025; H01L 33/24; H01L 33/20; H01L 33/007

USPC ........................................................... 257/76
See application file for complete search history.

(56) References Cited

U.S. PATENT DOCUMENTS

2006/0246612 A1* 11/2006 Emerson et al. ................ 438/22
2012/0168753 A1*  7/2012 Sanga ............................ 257/52

FOREIGN PATENT DOCUMENTS

| JP | 2002-368269 | 12/2002 |
|---|---|---|
| JP | 2006-228817 | 8/2006 |
| JP | 2008-071773 | 3/2008 |
| JP | 2008-218746 | 9/2008 |

* cited by examiner

Primary Examiner — William F Kraig
Assistant Examiner — Nga Doan
(74) *Attorney, Agent, or Firm* — F. Chau & Associates, LLC

(57) ABSTRACT

A semiconductor light emitting device includes a first conductive semiconductor layer including a V-shaped recess in a cross-sectional view. An active layer is disposed on the first conductive semiconductor layer, conforming to the shape of the V-shaped recess. An intermediate layer is disposed on the active layer and is doped with a first impurity. A second conductive semiconductor layer is disposed on the intermediate layer. The intermediate layer includes a first intermediate layer and a second intermediate layer. The first intermediate layer is disposed on the active layer, conforming to the shape of the V-shape recess. The second intermediate layer is disposed on the first intermediate layer and includes a protrusion to fill the V-shaped recess.

5 Claims, 5 Drawing Sheets

NITRIDE SEMICONDUCTOR LIGHT EMITTING DEVICE AND MANUFACTURING METHOD THEREOF

CROSS-REFERENCE TO RELATED APPLICATION

This application claims priority under 35 U.S.C. §119 to Korean Patent Application No. 10-2012-0022326, filed on Mar. 5, 2012, in the Korean Intellectual Property Office, the disclosure of which is incorporated by reference herein in its entirety.

TECHNICAL FIELD

The present invention relates to a nitride semiconductor light emitting device and a method of manufacturing, the same.

DISCUSSION OF THE RELATED ART

Light emitting diodes (LEDs) are p-n junction diodes that emit light through the electron-hole recombination process. LEDs have been widely used for illumination devices, display devices, and general light sources. For example, gallium nitride (GaN)-based semiconductors have been used for various products such as cellular phone keypads, side mirror turn signals, camera flashes and the like.

Recently, GaN-based semiconductors are also used for some applications requiring large-sized, high-output, and high-efficiency products such as backlight units for large-screen TVs, vehicle headlights, and general illumination devices.

SUMMARY OF INVENTION

According to an exemplary embodiment of the inventive concept, a semiconductor light emitting device includes a first conductive semiconductor layer including a V-shaped recess in a cross-sectional view. An active layer is disposed on the first conductive semiconductor layer, conforming to the shape of the V-shaped recess. An intermediate layer is disposed on the active layer and is doped with a first impurity. A second conductive semiconductor layer is disposed on the intermediate layer. The intermediate layer includes a first intermediate layer and a second intermediate layer. The first intermediate layer is disposed on the active layer, conforming to the shape of the V-shape recess. The second intermediate layer is disposed on the first intermediate layer and includes a protrusion to fill the V-shaped recess.

According to an exemplary embodiment of the inventive concept, to manufacture a semiconductor light emitting device, a first conductive semiconductor layer is formed to have a V-shaped recess in a cross-sectional view. An active layer is formed on the first conductive semiconductor layer. The active layer conforms to the shape of the V-shaped recess. A first intermediate layer including a first concentration of a first impurity is formed on the active layer. The first concentration increases vertically in the first intermediate layer. A second intermediate layer including a second concentration of the first impurity is formed on the first intermediate layer. The second concentration is more uniform than the first concentration. A second conductive semiconductor layer is formed on the second intermediate layer.

According to an exemplary embodiment of the inventive concept, to manufacture a semiconductor light emitting device, a V-shaped recess in a cross-sectional view is formed in a first conductive semiconductor layer. An active layer is formed on the first conductive semiconductor layer, conforming to the shape of the V-shaped recess. A first intermediate layer is formed on the active layer, wherein lateral growth of the first intermediate layer is suppressed under a first process condition and the first intermediate layer includes a first concentration of magnesium (Mg). A second intermediate layer is formed on the first intermediate layer under a second process condition to fill the V-shaped recess. The second intermediate layer includes a second concentration of magnesium (Mg). A second conductive semiconductor layer is formed on the second intermediate layer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
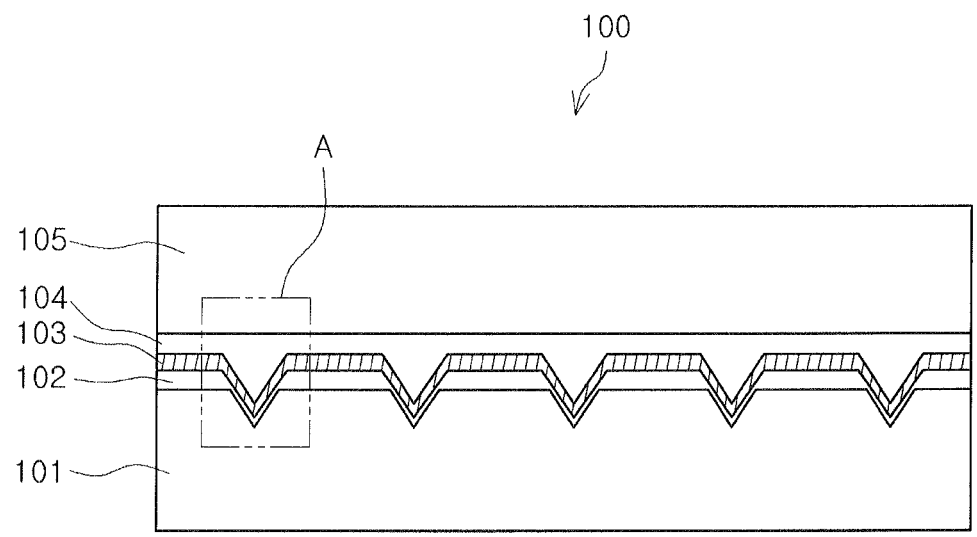
FIG. 1 is a cross-sectional view of a nitride semiconductor light emitting device according to an exemplary embodiment of the inventive concept.

Exemplary embodiments of the inventive concept will be described below in more detail with reference to the accompanying drawings. However, the inventive concept may be embodied in different forms and should not be construed as limited to the embodiments set forth herein. Rather, these exemplary embodiments are provided so that this disclosure will be thorough and complete and will fully convey the inventive concept to those skilled in the art. In the drawings, the thickness of layers and regions may be exaggerated for clarity. Like reference numerals may refer to the like elements throughout the specification and drawings.

Figure 4:
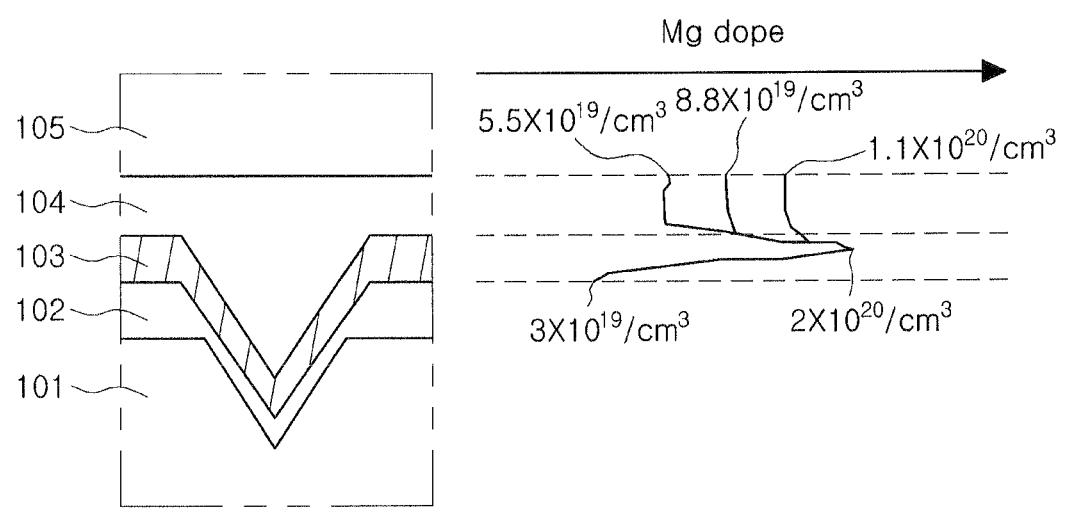
FIG. 4 is an enlarged view of part A of FIG. 1.

FIG. 1 is a cross-sectional view of a nitride semiconductor light emitting device according to an exemplary embodiment of the inventive concept. FIG. 4 is an enlarged view of part A of FIG. 1.

With reference to FIGS. 1 and 4, a nitride semiconductor light emitting device 100 according to an exemplary embodiment of the inventive concept may include a first conductive semiconductor layer 101 and a second conductive semiconductor layer 105. An active layer 102 may be interposed between the first and the second conductive semiconductor layers 101 and 105. Further, first and second intermediate layers 103 and 104 may be interposed between the active layer 102 and the second conductive semiconductor layer 105.

The first and second conductive semiconductor layers 101 and 105 may be respectively formed of a semiconductor material doped with an n-type impurity and a p-type impurity, expressed by an empirical formula: $Al_xIn_yGa_{(1-x-y)}N$ $Al_{x}$-$In_yGa_{1-x-y}N$, and representatively, GaN, AlGaN and InGaN may be used. Here, x and y values may satisfy and $0 \le x \le 1$, $0 \le y \le 1$ and $0 \le x+y \le 1$. Further, as the n-type impurity, silicon (Si), germanium (Ge), selenium (Se), tellurium (Te) or the like may be used. As the p-type impurity, magnesium (Mg), zinc (Zn), beryllium (Be) or the like may be used, and in an exemplary embodiment of the inventive concept, magnesium (Mg) may be used. In the case of the first and second conductive semiconductor layers 101 and 105, the conductive semiconductor layers may be grown by using a metal organic chemical vapor deposition (MOCVD) method, a molecular beam epitaxy (MBE) method, a hydride vapor phase epitaxy (HVPE) method, or the like, well-known in the art.

Figure 2:
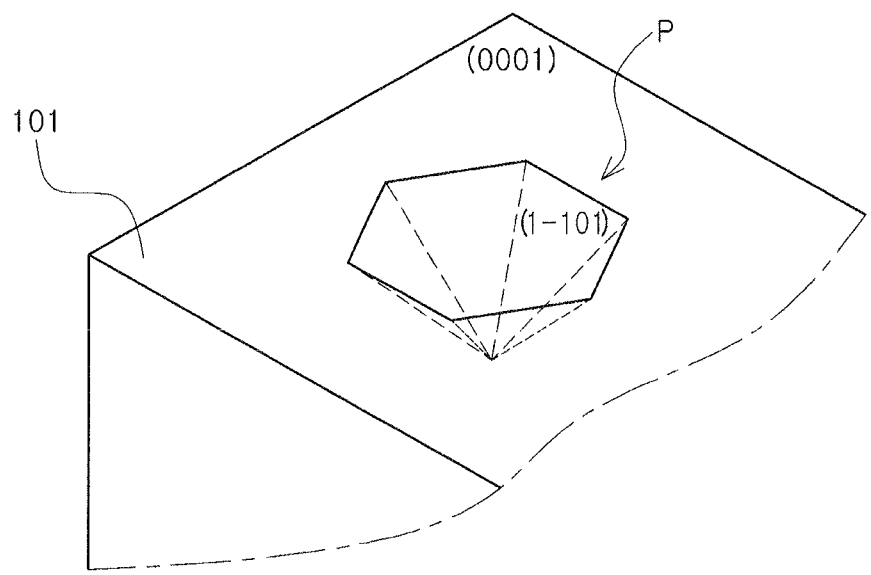
FIG. 2 is a perspective view of a pit structure shown in FIG. 1.
Figure 3:
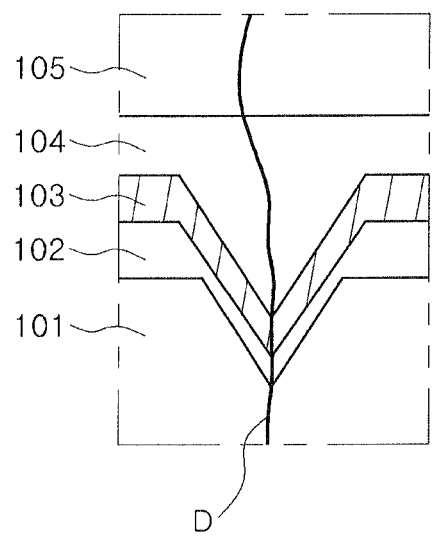
FIG. 3 is a cross-sectional view showing that the pit structure of FIG. 1 is formed in the vicinity of a dislocation.

According to an exemplary embodiment of the inventive concept, a pit structure may be formed in an upper surface of the first conductive semiconductor layer 101 of FIG. 1. FIG. 2 is a perspective view of a pit structure shown in FIG. 1, and FIG. 3 is a cross-sectional view showing the pit structure of FIG. 1 formed in the vicinity of a dislocation D.

Referring to FIG. 2, a pit P is a V-shaped pit formed in the first conductive semiconductor layer 101. The V-shaped pit may be used a V-shaped recess interchangeably. The pit P has a hexagonal pyramid shape whose surfaces are flat and oblique to an upper surface of the first conductive semiconductor layer 101 at a predetermined angle. For example, the first conductive semiconductor layer 101 has an upper surface having a (0001) crystal plane, and the pit P has surfaces having a (1-101) crystal plane. The pit T may be formed through etching partially an upper surface of the first conductive semiconductor layer after the first conductive semiconductor layer 101 has grown. In an exemplary embodiment of the inventive concept, a V-shape pit may be formed by controlling crystal growth conditions such as a growth rate, a temperature, and the like.

The active layer 102 may be formed on the first conductive semiconductor layer 101. The active layer 102 may be interposed between the first and second conductive semiconductor layers 101 and 105. The active layer 102 may serve to emit light having a certain amount of energy that is generated when electrons and holes recombine in the active layer 102. The active layer 102 may include a material whose energy band gap may be controlled. For example, the active layer 102 includes $In_yGa_{1-x}(0 \le x \le 1)$ whose energy band gap is controlled by the amount (x) of indium (In).

The active layer 102 may be formed on the first conductive semiconductor layer 101 including the pit P. The active layer 102 has a non-uniform thickness. For example, the active layer 102 has smaller thickness on an oblique plane of the pit V than that on the upper surface of the first conductive semiconductor layer 101. In other words, the active layer formed on the (0001) crystal plane has greater thickness that that formed on the (1-101) crystal plane. Accordingly, the active layer 102 formed on the upper surface of the first conductive semiconductor layer 101 has a larger energy band gap than that of the active layer 102 formed on the oblique plane of the pit P. Such difference in energy band gap may serve to block carriers from moving to a non-light emitting region such as the potential D and the like, thereby improving carrier recombination efficiency.

According to an exemplary embodiment of the inventive concept, an intermediate layer may be a single layer or a double layer.

Referring to FIG. 3, the V-shape pits may be formed in the vicinity of the potential D in the first conductive semiconductor layer 101. As described above, the V-shape pits may be formed by an etching process or by controlling crystal growth conditions such as a growth rate, a temperature, and the like.

Figure 5:
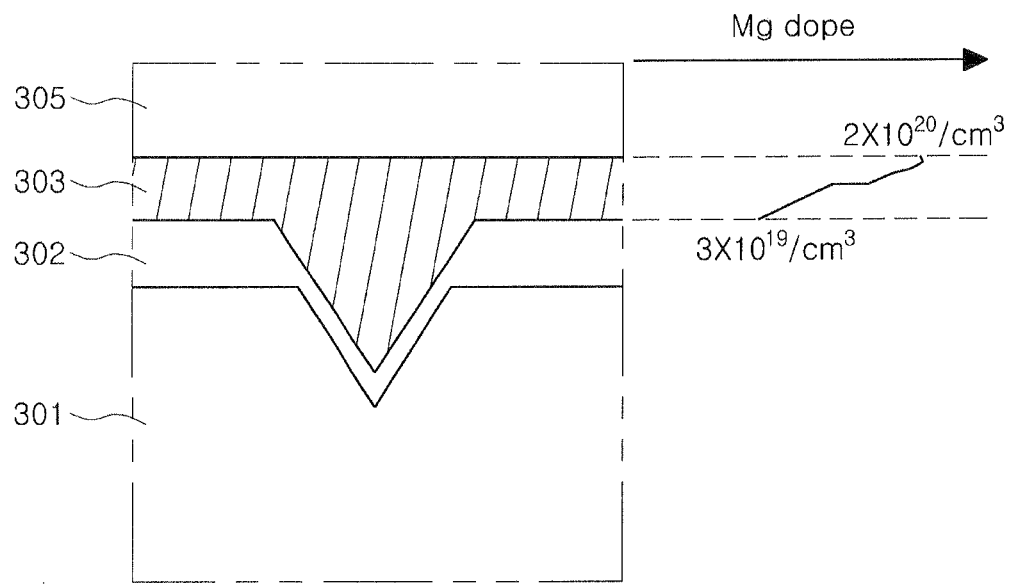
FIG. 5 shows a comparative example having a single intermediate layer as opposed to an exemplary embodiment of the inventive concept.
Figure 6:
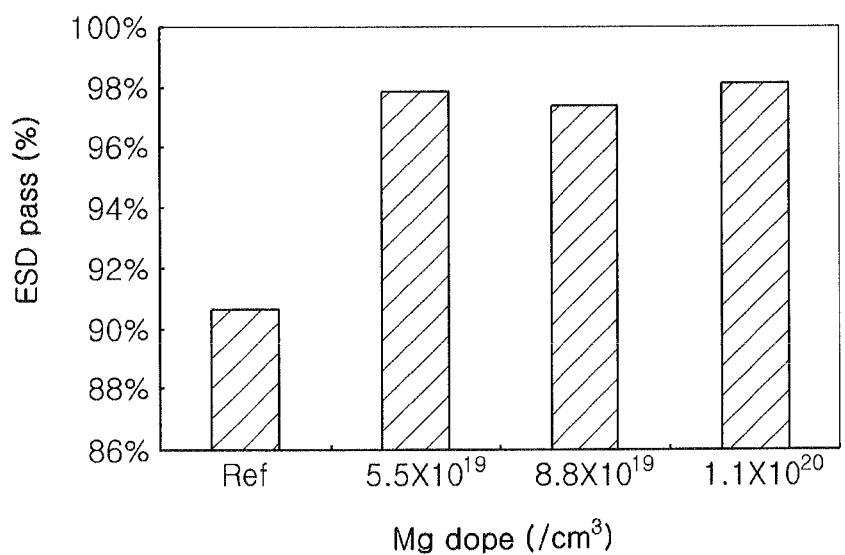
FIG. 6 shows electrostatic resistivity characteristics of a comparative example and an exemplary embodiment of the inventive concept.

Hereinafter, detailed explanation will be provided about concentrations of impurities doped in the first and the second intermediate layer and electrostatic resistivity characteristics with reference to FIGS. 4 to 6. FIG. 4 shows two intermediate layers formed in the V-shaped pit according to an exemplary embodiment of the inventive concept. As a comparative example, FIG. 5 shows a single intermediate layer formed in the V-shaped pit as opposed to an exemplary embodiment of the inventive concept. FIG. 6 shows electrostatic resistivity characteristics of a comparative example and an exemplary embodiment of the inventive concept.

Referring to FIG. 4, the first and the second intermediate layers 103 and 104 may be disposed on the active layer 102. The layers 103 and 104 may be doped with p-type impurities when the first and the second intermediate layers 013 and 104 are being formed. The p-type impurities might not be well doped in the intermediate layers 103 and 104 formed on the oblique plane of the active layer 102 as compared to that formed on the upper surface of the active layer 102. Such low doping profile in the first and second intermediate layers 103 and 104 formed on the oblique plane of the active layer 102 may result in high resistance and may enable the first and the second intermediate layer 103 and 104 to serve as an electrical passivation structure.

Referring to FIG. 5, an active layer 102 and an intermediate layer 303 are formed on a first conductive semiconductor layer 101 having a pit and the pit P may be filled by the intermediate layer 301 as opposed to that of FIG. 4.

As shown in FIG. 5, when an impurity such as magnesium (Mg) is doped in the intermediate layer 303, a concentration of the impurity may increase due to a doping delay phenomenon. The impurity such as magnesium may take some time to distribute uniformly when it is doped. At the time of an initial doping, a doping concentration is not stabilized, and thus a lower portion of the intermediate layer 303 includes a relatively low concentration, i.e., a relatively low resistance. Upper portion of the intermediate layer 303 filled in the recess portion of the active layer 102 includes an impurity concentration gradually increasing toward an upper part thereof. As such, a lumped resistance of the intermediate layer formed in the pit P may be relatively low due to the low resistance of the lower portion and thus an electrostatic resistivity characteristic of a light emitting device may be low.

According to an exemplary embodiment of the inventive concept, as shown in FIG. 4, the first intermediate layer 103 has an impurity concentration which increases as the thickness of the first intermediate layer 103 increases. The second intermediate layer 104 has a more uniform impurity concentration profile as compared to that of the first intermediate layer 103. The combined intermediate layers 103 and 104 may constitute an intermediate layer having a relatively high resistance and may avoid such problem that a pit P is covered by a region of low resistance.

The first intermediate layer 103 may be formed on an upper surface of the active layer 102 under a process condition that may suppress a lateral growth of the first intermediate layer 103 so that the first intermediate layer 103 may have a recess portion formed on the pit P. For example, the process condition includes a low growth temperature of about 850° C. through about 1000° C. Since the first intermediate layer 103 is formed under a condition that the lateral growth of the first intermediate layer 103 is suppressed at a relatively low temperature, the first intermediate layer 103 may be formed on an upper surface of the active layer 102 such that it has a recess portion therein. The first intermediate layer 103 may be formed up to a region in which an impurity doping concentration becomes uniform, but in the exemplary embodiment of the inventive concept, an impurity, for example, a magnesium (Mg) concentration, may be gradually increased in a range of $3\times10^{19}/cm^3$ through $2\times10^{20}/cm^3$.

The second intermediate layer 104 may be formed on the first intermediate layer 103 and may fill a recess portion in the first intermediate layer 103. The second intermediate layer 104 is also grown laterally at a relatively high growth temperature and the recess portion of the first intermediate layer 103 is filled by such lateral growth. An upper surface of the second intermediate layer 104 may be flat. An upper surface of the second intermediate layer 104 may be flat. For example, the second intermediate layer 104 may be formed at a relatively high growth temperature range of about 950° C. through about 1150° C. The second intermediate layer 104 may have more uniform an impurity doping concentration than that of the first intermediate layer 103 and may have a doping concentration, for example, about $5\times10^{19}/cm^3$, about $8.8\times10^{19}/cm^3$ or about $1.1\times10^{20}/cm^3$.

Since the second intermediate layer 104 may be formed to fill the recess portion of the first intermediate layer 103 so as to have a more uniform doping concentration than that of the first intermediate layer 103, a resistance value in the pit may be high as compared with that of FIG. 5. FIG. 6 is a diagram showing electrostatic resistivity characteristics of a nitride semiconductor light emitting device according to an exemplary embodiment of the inventive concept. For purpose of comparison, a nitride semiconductor light emitting device of FIG. 5 (Ref) is used as a comparison example. The comparison example includes a doping concentration less than that according to an exemplary embodiment of the inventive concept. When the second intermediate layer 104 has a doping concentration, for example, about $5\times10^{19}/cm^3$, about $8.8\times10^{19}/cm^3$ or about $1.1\times10^{20}/cm^3$, electrostatic resistivity characteristic of the second intermediate layer 104 increases about 7% or more as compared with that of comparison example (Ref).

Hereinafter, a method of manufacturing a nitride semiconductor light emitting device having the structure described above according to an exemplary embodiment of the inventive concept will be described.

Figure 7:
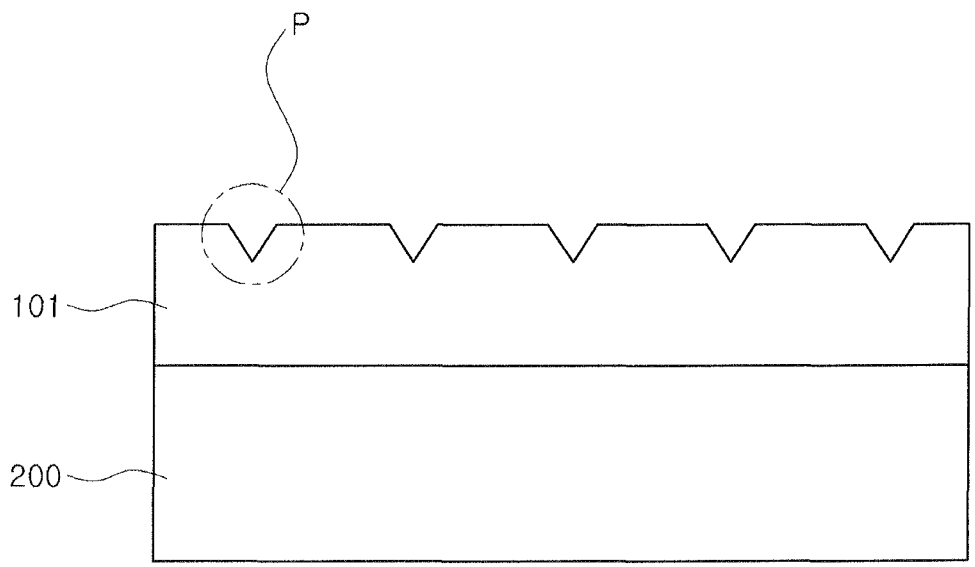
FIGS. 7 to 10 illustrate a method of manufacturing a nitride semiconductor light emitting device according to an exemplary embodiment of the inventive concept.

FIGS. 7 to 10 illustrate a method of manufacturing a nitride semiconductor light emitting device in respective processes according to an exemplary embodiment of the inventive concept. First, as shown in FIG. 7, a first conductive semiconductor layer 101 having a pit (P) structure may be formed on an upper surface of a growth substrate 200. The growth substrate 200 may include a material such as sapphire, Si, ZnO, GaAs, SiC, $MgAl_2O_4$, MgO, $LiAlO_2$, $LiGaO_2$, GaN or the like. According to an exemplary embodiment of the inventive concept, the growth substrate 200 includes sapphire whose crystal structure may be a hexa-rhombo R3c symmetrical structure and lattice constants in c-axis and a-axis directions are respectively 13.001 Å and 4.758 Å. The crystal structure may include a C (0001) plane, an A (1120) plane, an R (1102) plane and the like.

According to an exemplary embodiment of the inventive concept, the growth substrate 200 includes a sapphire substrate whose upper surface is a C plane. Nitride thin film may be relatively easily formed on the C plane compared to other crystal planes. Nitride thin film formed on the C plane may be stable at a relatively high temperature.

The first conductive semiconductor layer 101 may be grown by using a metal organic chemical vapor deposition (MOCVD) method, a molecular beam epitaxy (MBE) method, a hydride vapor phase epitaxy (HVPE) method, or the like. The dislocation D of FIG. 3 may occur due to lattice mismatch between the first conductive semiconductor layer 101 and the growth substrate 200. A pit (P) structure may be formed in the vicinity of the dislocation D of FIG. 3 through etching the first conductive semiconductor layer 101. In an exemplary embodiment of the inventive concept, the pit structure may be formed when the first conductive semiconductor layer 101 is grown on the growth substrate 200 by controlling growth conditions such as a growth rate, a temperature, or the like. In this case, as described above, since a region of high resistance may be formed on an oblique plane of the pit P by the intermediate layers 103 and 104, the pit P may have a sufficiently large size in which the first intermediate layer 103 to be formed therein cannot fill the pit P at a relatively low temperature, but it does not matter that the pit P has a relatively small size in which an upper surface of the second intermediate layer 104 formed on the first intermediate layer 103 may be flat, whereby a sufficient light emitting region may be secured.

Figure 8:
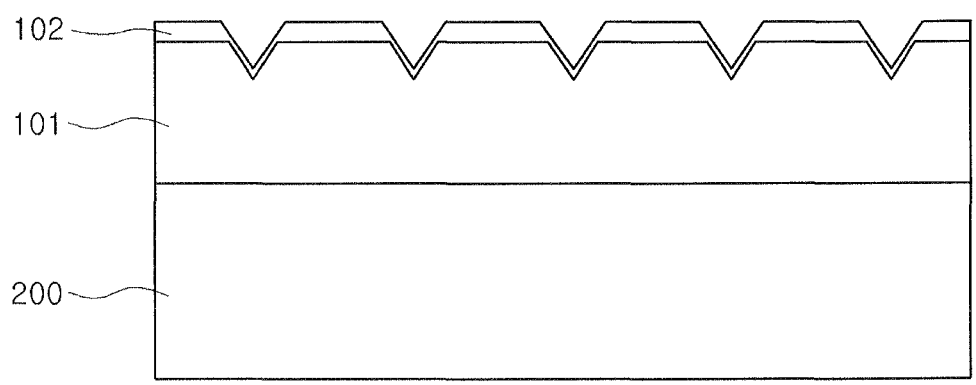

As shown in FIG. 8, the active layer 102 may be formed on the first conductive semiconductor layer 101. The active layer 102 may include a material whose energy band gap may be controlled. For example, the active layer 102 includes $In_xGa_{1-x}N(0\leq x\leq 1)$ whose energy band gap is controlled by the amount (x) of indium (In). The active layer 102 may be formed through a general nitride semiconductor growth process. The active layer 102 may have a recess portion in a region corresponding to the pit P and a portion of the active layer 102 corresponding to an oblique plane of the pit P may be relatively thin and may have a relatively large energy band gap such that prevents carriers from moving toward the pit having a relatively high defect density.

Figure 9:
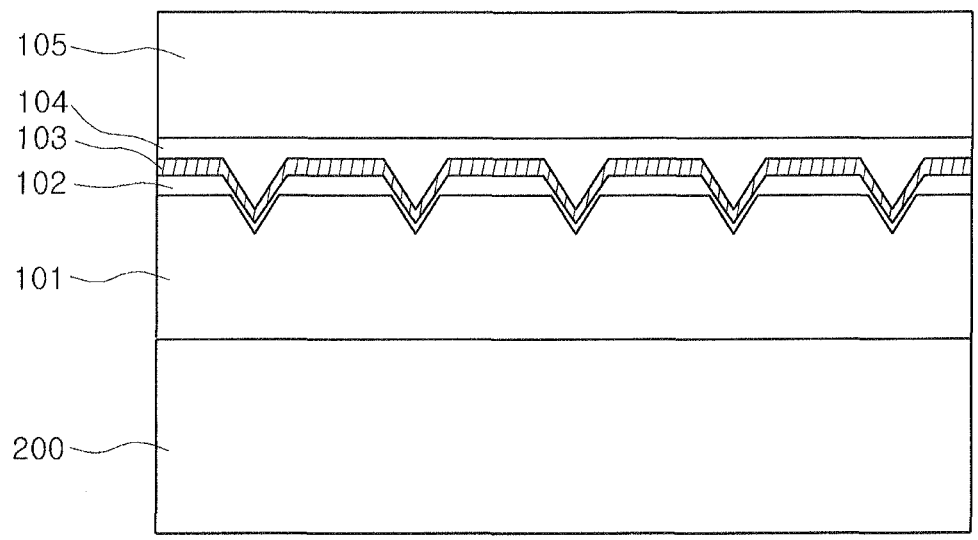

As shown in FIG. 9, first and second intermediate layers 103 and 104 may be formed on the active layer 102. The intermediate layers 103 and 104 may include a semiconductor layer doped with a p-type impurity. The first intermediate layer 103 may be formed on the active layer 102 under a growth condition which may suppress the first intermediate layer 103 from growing laterally. For example, the first intermediate layer 103 may be formed at a relatively low temperature range of, for example, about 850° C. through about 1000° C. The first intermediate layer 103 may include a region in which an impurity doping concentration becomes uniform. When the p-type impurity is magnesium (Mg), a magnesium (Mg) concentration may gradually increase within a range of $3\times10^{19}/cm^3$ through $2\times10^{20}/cm^3$ as shown in FIG. 4.

The second intermediate layer 104 may be formed on an upper surface of the first intermediate layer 103 to such a thickness that it fills a recess portion of the first intermediate layer 103. The second intermediate layer 104 is also grown laterally at a relatively high growth temperature and the recess portion of the first intermediate layer 103 is filled by such lateral growth. An upper surface of the second intermediate layer 104 may be flat. For example, the second intermediate layer 104 may be formed at a high growth temperature range of about 950° C. through about 1150° C. The second intermediate layer 104 may have more uniform an impurity doping concentration than that of the first intermediate layer 103 and may have a doping concentration, for example, about $5\times10^{19}/cm^3$, about $8.8\times10^{19}/cm^3$ or about $1.1\times10^{20}/cm^3$. As shown in FIG. 6, when the second intermediate layer 104 has such doping concentrations, electrostatic resistivity characteristics of the second intermediate layer 104 increases about 7% or more as compared with that of comparison sample (Ref).

Figure 10:
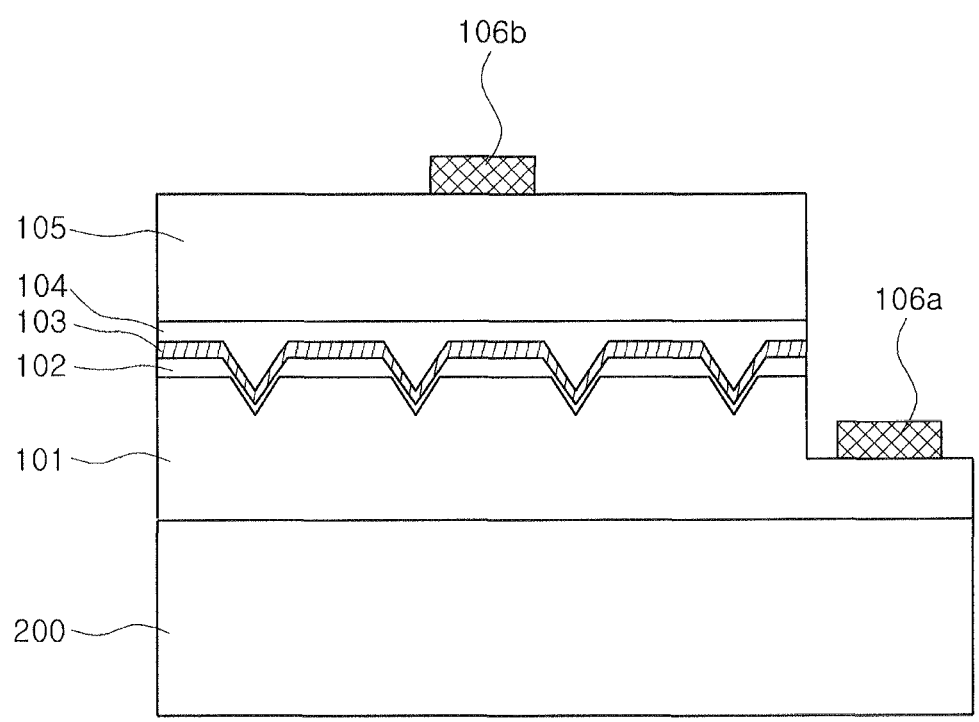

As shown in FIG. 10, part of the structure of FIG. 9 may be etched to the extent that a portion of the first conductive semiconductor layer 101 has an exposed surface lower than the upper surface of the first conductive semiconductor layer 101. A first electrode 106a may be formed on the exposed surface of the first conductive semiconductor layer 101. A second electrode 106b may be formed on the second conductive semiconductor layer 105. A transparent electrode (now shown) formed of a transparent material such as indium tin oxide (ITO), zinc oxide (ZnO), or the like may be provided an ohmic contact between the second conductive semiconductor layer 105 and the second electrode 106b. According to an embodiment of the inventive concept, the first and second electrodes 106a and 106b may be formed to be directed toward an upper part thereof, that is, may pertain to, for example, a horizontal electrode structure. In an exemplary embodiment of the inventive concept, the structure may be applied to a vertical electrode structure so as to improve a current distribution function.

As set forth above, according to an exemplary embodiment of the inventive concept, a nitride semiconductor light emitting device may have improved electrical characteristics, for example, improved electrostatic resistivity, and thus, reliability in a light emitting device may be secured.

What is claimed is:

1. A method of manufacturing a semiconductor light emitting device comprising:

forming a V-shaped recess in a cross-sectional view in a first conductive semiconductor layer;

forming an active layer on the first conductive semiconductor layer, the active layer conforming to the shape of the V-shaped recess;

forming a first intermediate layer on the active layer, wherein lateral growth of the first intermediate layer is suppressed under a first process condition and the first intermediate layer includes a first concentration of magnesium (Mg);

forming a second intermediate layer on the first intermediate layer under a second process condition to fill the V-shaped recess, wherein the second intermediate layer includes a second concentration of magnesium (Mg); and forming a second conductive semiconductor layer on the second intermediate layer.

2. The method of claim 1, wherein the first intermediate layer includes a first thickness on an upper surface of the active layer and a second thickness in the V-shaped recess, the first thickness being greater than the second thickness.

3. The method of claim 1, wherein the second intermediate layer includes a third thickness on an upper surface of the first intermediate layer, wherein the second concentration includes a substantially uniform concentration.

4. The method of claim 1, wherein the first concentration increases vertically from about $3 \times 10^{19}/cm^3$ to about $2 \times 10^{20}/cm^3$, and the second concentration includes a substantially uniform concentration between about $5.5 \times 10^{19}/cm^3$ and about $1.1 \times 10^{20}/cm^3$.

5. The method of claim 1, wherein the first process condition includes a temperature between about 850° C. and about 1000° C. and the second process condition includes a temperature between about 950° C. and about 1150° C.

* * * * *